United States Patent
Tsuchiya et al.

(10) Patent No.: US 7,510,787 B2
(45) Date of Patent: *Mar. 31, 2009

(54) MAGNETO-RESISTANCE EFFECT ELEMENT AND THIN-FILM MAGNETIC HEAD

(75) Inventors: Yoshihiro Tsuchiya, Tokyo (JP); Tomohito Mizuno, Tokyo (JP); Daisuke Miyauchi, Tokyo (JP); Koji Shimazawa, Tokyo (JP)

(73) Assignee: TDK Corporation, Tokyo (JP)

( * ) Notice: Subject to any disclaimer, the term of this patent is extended or adjusted under 35 U.S.C. 154(b) by 69 days.

This patent is subject to a terminal disclaimer.

(21) Appl. No.: 11/671,248

(22) Filed: Feb. 5, 2007

(65) Prior Publication Data

US 2007/0183098 A1 Aug. 9, 2007

(30) Foreign Application Priority Data

| Feb. 6, 2006 | (JP) | ............................. 2006-028217 |
| Dec. 6, 2006 | (JP) | ............................. 2006-329644 |

(51) Int. Cl.
*G11B 5/39* (2006.01)
(52) U.S. Cl. .................................................. 428/811.2
(58) Field of Classification Search ........................ None
See application file for complete search history.

(56) References Cited

U.S. PATENT DOCUMENTS

| 6,937,446 B2 | 8/2005 | Kamiguchi et al. |
| 6,977,801 B2 * | 12/2005 | Carey et al. ............. 360/324.11 |
| 7,046,489 B2 | 5/2006 | Kamiguchi et al. |
| 7,132,175 B2 * | 11/2006 | Hasegawa et al. ......... 428/811.2 |
| 2003/0161181 A1 * | 8/2003 | Saito et al. ................... 365/173 |

FOREIGN PATENT DOCUMENTS

| JP | 2002-208744 A | 7/2002 |
| JP | 2003-218428 | 7/2003 |
| JP | 2003-318462 A | 11/2003 |
| JP | 2003-338644 A | 11/2003 |
| JP | 2005-505932 A | 2/2005 |
| JP | 2006-261306 | 9/2006 |

OTHER PUBLICATIONS

H. Fukuzawa. et al., CPP-GMR Spin-Valve Films with a Current-Confined-Path Nano-Oxide-Layer (CPP-NOL), Japan Apply Magnetism Journal vol. 29, No. 9, 2005.

* cited by examiner

*Primary Examiner*—Holly Rickman
*Assistant Examiner*—Gary D Harris
(74) *Attorney, Agent, or Firm*—Knobbe Martens Olson & Bear, LLP

(57) ABSTRACT

An MR element has a pinned layer, a spacer layer, and a free layer successively stacked in the order named. The free layer includes a Heusler alloy layer in at least a region thereof adjacent to the spacer layer. An oxide is distributed as sea-islands in the interface between the Heusler alloy layer and the spacer layer. The Heusler alloy layer virtually has a stoichiometric composition. The oxide has an RA in the range from 0.10 $\Omega\mu m^2$ to 0.36 $\Omega\mu m^2$.

12 Claims, 6 Drawing Sheets

MAGNETO-RESISTANCE EFFECT ELEMENT AND THIN-FILM MAGNETIC HEAD

BACKGROUND OF THE INVENTION

1. Field of the Invention

The present invention relates to a magneto-resistance effect element and a thin-film magnetic head which are preferable for use in hard disk drives.

2. Description of the Related Art

Hard disk drives employ a thin-film magnetic head having a magneto-resistance effect element (MR element) for reading magnetic signals. In recent years, efforts have been made to design hard disk drives for higher recording densities, and accordingly there are growing demands for thin-film magnetic heads, particularly magneto-resistance effect elements, which satisfy higher-sensitivity and higher-output requirements.

To meet the demands, there has been developed a magneto-resistance effect element including a spin-valve film (SV film) that has a structure wherein a nonmagnetic spacer layer is sandwiched between a pinned layer whose magnetization direction is fixed and a free layer whose magnetization direction is variable depending on an external magnetic field. The pinned layer and the free layer are formed as ferromagnetic layers. The pinned layer has its magnetization direction fixed by being disposed on an antiferromagnetic layer. Recently, there has been developed a synthetic SV film including a pinned layer that has a three-layer structure comprising a ferromagnetic layer, a nonmagnetic metal layer, and a ferromagnetic layer, rather than a single-layer structure having a ferromagnetic layer, so that a strong exchange coupling is given between the two ferromagnetic layers to effectively increase the exchange coupling force from the antiferromagnetic layer.

There has also been proposed a CPP (Current-Perpendicular-to-Plane) magneto-resistance effect element in which a sensing current flows perpendicularly to a layer surface for an increased output. It is desirable in the CCP magneto-resistance effect element that the ferromagnetic layer has a large polarizability. If the polarizability is large, then the rate of change of the magneto-resistance (also referred to as MR ratio), which serves as an indicator representative of the sensitivity of the magneto-resistance effect element, is large. Particularly, a TMR element employing a Heusler alloy ($Co_2MnAl$, $Co_2MnSi$, or $Co_2MnGe$) which has a relatively high Curie temperature has a relatively high MR ratio at room temperature.

Japanese Patent Application Laid-Open No. 2003-218428 discloses a magneto-resistance effect element wherein at least one of the pinned and free layers has a ferromagnetic half-metal alloy layer. Japanese Patent Application Laid-Open No. 2003-218428 shows, as an example of the ferromagnetic half-metal alloy layer, a layer made of a full-Heusler alloy expressed by a composition formula $X_2YZ$ (where X represents an element selected from groups 3A to 2B of the periodic table, Y represents Mn, and Z represents one or more elements selected from Al, Si, Ga, In, Sn, Ti, and Pb).

As one of means for increasing the MR ratio of a magneto-resistance effect element, it has been proposed to insert an extremely thin oxide layer (NOL: Nano-oxide-layer) between a pinned layer and a free layer for thereby confining current path in a spin-valve film (Japanese Patent Application Laid-Open No. 2002-208744). According to the proposal, the flow of a sensing current is controlled to maximize the effect of a spin-dependent dispersion which the material has. Transaction of the Magnetic Society of Japan, Vol. 29, No. 9, pp. 869-877 (2005) discloses the recent data of a confined-current-path type CPP-GMR element. FIG. 5 of the document shows that the RA value that is resistance value per unit area of the element is 0.57 $\Omega\mu m^2$ and the MR ratio is 8.2%.

If a magneto-resistance effect element is applied to a thin-film magnetic head having a recording density in excess of 300 Gbpsi, then the S/N ratio is better as RA is lower and the MR ratio is higher. However, the confined-current-path type magneto-resistance effect element disclosed in Transactions of the Magnetic Society of Japan, Vol. 29, No. 9, pp. 869-877 (2005) has suffered a problem in that RA has to be large in order to obtain the effect according to the confining current path. Actually, according to FIG. 5 of the document, the MR ratio is about 4 through 5% in a practical low RA range (RA=0.2 through 0.3 $\Omega\mu m^2$). The inserted oxide layer gives rise to the problem of excessive oxidation of the pinned and free layers adjacent thereto.

For a magneto-resistance effect element employing a Heusler alloy, it is extremely important that the Heusler alloy have a particular crystalline structure (L21 structure or B2 structure) in order to achieve a high polarizability. In order for the Heusler alloy to have the particular crystalline structure, it is important that the proportions of the elements X, Y, Z of the Heusler alloy be represented virtually by a stoichiometric composition. The stoichiometric composition for the Heusler alloy is X:Y:Z=2:1:1 for a full-Heusler alloy and X:Y:Z=1:1:1 for a half-Heusler alloy.

If a full-Heusler alloy layer is actually provided adjacent to the spacer layer, then the proportions of the elements of the full-Heusler alloy layer are varied due to mutual diffusion of the layers, making it difficult to achieve the above particular crystalline structure. As a result, the polarizability of the pinned and free layers is not large as desired, and the use of the full-Heusler alloy is not effective-enough.

SUMMARY OF THE INVENTION

It is an object of the present invention to provide a magneto-resistance effect element and a thin-film magnetic head which have a low RA and a high MR ratio in the case-where at least one of a pinned layer and a free layer has a Heusler alloy layer.

To achieve the above object, a magneto-resistance effect element according to the present invention comprises a pinned layer having a fixed magnetization direction, a free layer having a magnetization direction variable depending on an external magnetic field, a nonmagnetic spacer layer disposed between the pinned layer and the free layer. Further, in the magneto-resistance effect element according to the present invention comprises, at least one of said pinned layer and said free layer includes a Heusler alloy layer which is disposed adjacent to the spacer layer and which virtually has a stoichiometric composition, and an oxide is distributed as sea-islands in an interface between at least one of the Heusler alloy layers and the spacer layer. The magneto-resistance effect element has an areal resistance value (RA) in the range from 0.10 $\Omega\mu m^2$ to 0.36 $\Omega\mu m^2$.

With the magneto-resistance effect element according to the present invention, the oxide is disposed in the interface between the spacer layer and the Heusler alloy layer adjacent thereto, suppressing mutual diffusion between the spacer layer and the Heusler alloy layer. Because the oxide is distributed as sea-islands, any increase in the electric resistance of the magneto-resistance effect element due to the oxide is suppressed. The Heusler alloy layer disposed adjacent to the spacer layer virtually has a stoichiometric composition or the areal resistance value of the magneto-resistance effect element is in the range from 0.10 $\Omega\mu m^2$ to 0.36 $\Omega\mu m^2$ is effective to prevent oxygen contained in the oxide interposed between the Heusler alloy layer and the spacer layer from being diffused into the Heusler alloy layer. As a result, the magneto-resistance effect element maintains a low RA and achieves a high MR ratio.

The Heusler alloy layer should preferably be made of a Heusler alloy expressed by a composition formula $X_2YZ$ or XYZ (where X represents one or more elements selected from Co, Ir, Rh, Pt, and Cu, Y represents one or more elements selected from V, Cr, Mn, and Fe, and Z represents one or more elements selected from Al, Si, Ga, Sb, and Ge).

The oxide interposed between the Heusler alloy layer and the spacer layer should preferably comprise an oxide made of at least one raw material having a higher energy level for bonding itself to oxygen than the material of a layer which serves as a base for the oxide. Specifically, if the free layer includes the Heusler alloy layer therein, and the spacer layer is made of Cu, then the energy level for bonding the raw material to oxygen should preferably be 500 kJ/mol. or higher. The raw material composes, for example, one or more elements selected from the group consisting of Al, Si, Mg, Ti, V, Zr, Nb, Mo, Ru, Hf, Ta, and W.

The pinned layer may have a nonmagnetic intermediate layer and two ferromagnetic layers interposing the nonmagnetic intermediate layer therebetween.

For effectively achieving a high polarizability of the Heusler alloy layer and a reduction in the increase in the electric resistance of the magneto-resistance effect element, the ratio of the total area of a region where the oxide is provided to the entire interface between the Heusler alloy layer should preferably be less than 50%.

A Heusler base layer may be disposed between the oxide distributed as the sea-islands and the Heusler alloy layer. If the Heusler base layer is included, then it should preferably be made of CoXY, Go being 70 at % or greater and less than 100 at %, X representing at least one of Fe, Mn, and Cr, and Y representing at least one of Si, Ge, Al, and Sb. The proportions of X and Y of the Heusler base layer should preferably be 1:1. The Heusler base layer should preferably have a thickness ranging from 0.3 nm to 1.5 nm.

According to the present invention, there is also provided a thin-film magnetic head having the magneto-resistance effect element according to the present invention as described above.

According to the present invention, the magneto-resistance effect element maintains a low RA and achieves a high MR ratio by employing a structure wherein the oxide is distributed as sea-islands between the Heusler alloy layer and the spacer layer, and the Heusler alloy layer virtually has a stoichiometric composition or the RA of the magneto-resistance effect element is in the range from 0.10 $\Omega\mu m^2$ to 0.36 $\Omega\mu m^2$.

The above and other objects, features, and advantages of the present invention will become apparent from the following description with reference to the accompanying drawings which illustrate embodiments of the present invention.

DETAILED DESCRIPTION OF THE PREFERRED EMBODIMENTS

Embodiments of the present invention will be described below with reference to the drawings.

Figure 1:
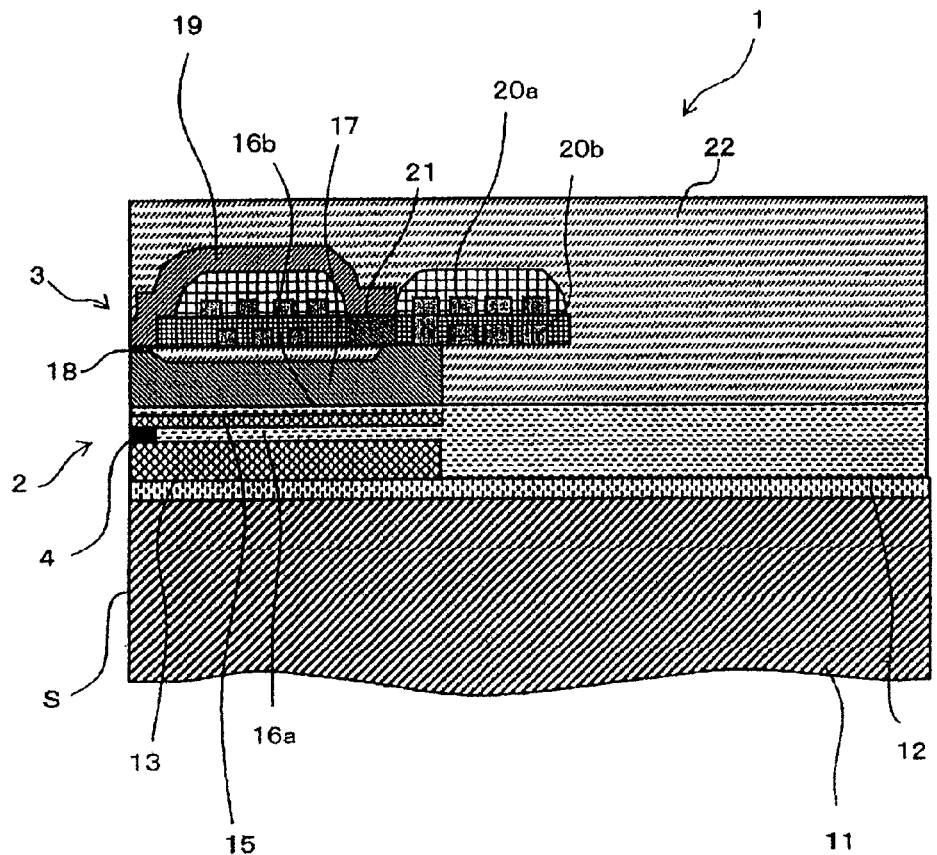
FIG. 1 is a cross-sectional view of a major portion of a thin-film magnetic head according to an embodiment of the present invention.

FIG. 1 conceptually shows a cross-sectional view of a major portion of a thin-film magnetic head according to an embodiment of the present invention.

Thin-film magnetic head 1 according to the present embodiment has substrate 11, reproducing unit 2 which reads out data from a recording medium (not shown) and which is formed on substrate 11, and recording unit 3 for writing data on a recording medium (not shown) and which is formed on substrate 11.

Substrate 11 is made of $Al_2O_3$.TiC (AlTiC) of excellent wear resistance. Base layer 12 of alumina is disposed on an upper surface of substrate 11, and reproducing unit 2 and recording unit 3 are stacked on base layer 12.

Lower shield layer 13 made of a magnetic material such as Permalloy (NiFe), for example, is disposed on base layer 12. MR element 4 is disposed on lower shield layer 13 at an end thereof near surface S to face a recording medium and has an end exposed on surface S to face a recording medium. First upper shield layer 15 made of a magnetic material such as Permalloy, for example, is disposed on MR element 4. Lower shield layer 13, MR element 4, and first upper shield layer 15 jointly make up reproducing unit 2. Insulating layer 16a is primarily disposed in a region between lower shield layer 13 and first upper shield layer 15 which is free of MR element 4.

Lower magnetic pole layer 17 made of a magnetic material such as Permalloy or CoNiFe is disposed on first upper shield layer 15 with insulating layer 16b interposed therebetween. Lower magnetic pole layer 17 functions as a lower magnetic pole layer of recording unit 3 and also as an upper shield layer of MR element 4.

Upper magnetic pole layer 19 is disposed on lower magnetic pole layer 17 with recording gap layer 18 interposed therebetween which is made of a nonmagnetic material such as Ru or alumina. Recording gap layer 18 is disposed on lower magnetic pole layer 17 at an end thereof near surface S to face a recording medium and has an end exposed on surface S to face a recording medium. Upper magnetic pole layer 19 is made of a magnetic material such as Permalloy or CoNiFe. Lower magnetic pole layer 17 and upper magnetic pole layer 19 are magnetically connected to each other by connector 21, and they make up a magnetic circuit as a whole.

Coils 20*a*, 20*b* made of an electrically conductive material such as copper are disposed as two layers between lower magnetic pole layer 17 and upper magnetic pole layer 19 and also between surface S to face a recording medium and connector 21. Each of coils 20*a*, 20*b* serves to supply magnetic fluxes to lower magnetic pole layer 17 and upper magnetic pole layer 19 and has a planar spiral shape surrounding connector 21. Coils 20*a*, 20*b* are insulated from the surrounding region by an insulating layer. Though coils 20*a*, 20*b* in the two layers are illustrated in this embodiment, they are not limited to the two layers, but may be in one layer or three or more layers.

Overcoat layer 22 is disposed in covering relation to upper magnetic pole layer 19, and protects the structure described above. Overcoat layer 22 is made of an insulating material such as alumina, for example.

MR element 4 will be described in detail below with reference to FIG. 2, which is a view of MR element 4 shown in FIG. 1 as viewed from surface S to face a recording medium.

As described above, MR element 4 is interposed between lower shield layer 13 and upper shield layer 15. MR element 4 has a structure comprising buffer layer 41, antiferromagnetic layer 42, pinned layer 43, spacer layer 44, free layer 45, and cap layer 46 which are stacked successively in this order from the lower shield layer 13 side. Pinned layer 43 is of a structure wherein nonmagnetic intermediate layer 43*b* is interposed between outer layer 43*a* and inner layer 43*c* each made of a ferromagnetic material. Pinned layer 43 having such a structure is referred to as a synthetic pinned layer. Outer layer 43*a* is held in contact with antiferromagnetic layer 42, and inner layer 43*c* is held in contact with spacer layer 44.

Lower shield layer 13 and upper shield layer 15 also act as electrodes. A sensing current flows to MR element 4 through lower shield layer 13 and upper shield layer 15 in a direction perpendicular to layer surfaces.

Buffer layer 41 is made of a material combination which provides good exchange coupling to antiferromagnetic layer 42 and outer layer 43*a* of pinned layer 43. For example, buffer layer 41 comprises a laminated film of Ta/NiCr, Ta/Ru, Ta/NiFe, or the like. Antiferromagnetic layer 42 serves to fix the magnetization direction of pinned layer 43, and is made of IrMn, PtMn, RuRnMn, NiMn, or the like, for example.

Pinned layer 43 is formed as a magnetic layer, and, as described above, has a structure wherein outer layer 43*a*, nonmagnetic intermediate layer 43*b*, and inner layer 43*c* are stacked in the order named. Outer layer 43*a* has fixed magnetization direction secured with respect to an external magnetic field by antiferromagnetic layer 42. For example, outer layer 43*a* comprises a laminated film of CoFe/FeCo/CoFe. Nonmagnetic intermediate layer 43*b* is made of Ru, for example. Inner layer 43*c* is made of a magnetic material such as CoFe or NiFe, for example, and may have a single-layer structure or a multi-layer structure. In the synthetic pinned layer, magnetic moments of outer layer 43*a* and inner layer 43*c* cancel each other out, to suppress an overall leaking magnetic field, and inner layer 43*c* has firmly fixed magnetization direction.

Spacer layer 44 is made of a nonmagnetic material. Spacer layer 44 may be made of Cu, Au, Ag, Cr, or the like. Of these materials, Cu is particularly preferable.

Free layer 45 is made of a magnetic material and has its magnetization direction variable depending on the external magnetic field. In the present embodiment, free layer 45 has a layer of Heusler alloy. Free layer 45 may have a layer of CoFe or NiFe, which is generally used as a ferromagnetic layer, stacked on the layer of Heusler alloy. At any rate, the layer of Heusler alloy is positioned in contact with spacer layer 44.

Figure 3:
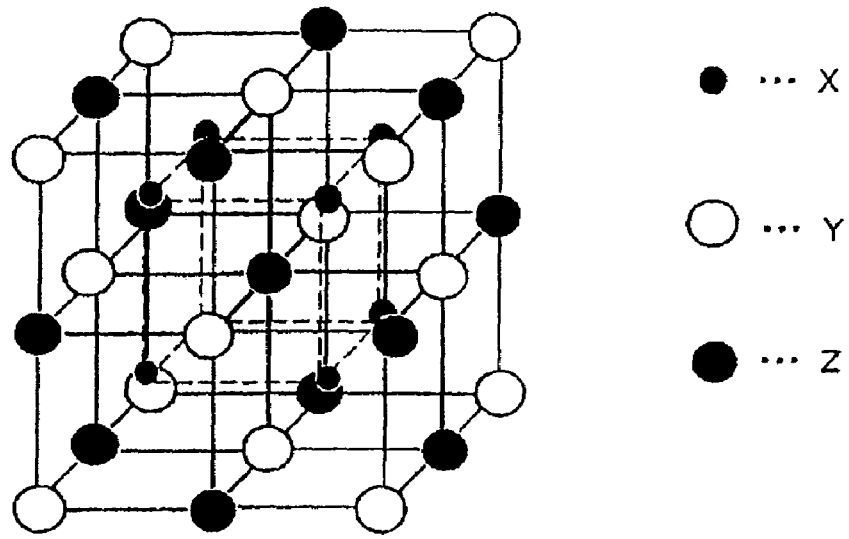
FIG. 3 is a diagram showing the layout of elements of a full-Heusler alloy which has an L21 structure.

The Heusler alloy used in the present embodiment is an alloy expressed by a composition formula $X_2YZ$ or $XYZ$, where X represents one or more elements selected from Co, Ir, Rh, Pt, and Cu, Y represents one or more elements selected from V, Cr, Mn, and Fe, and Z represents one or more elements selected from Al, Si, Ga, Sb, and Ge. Specifically, the Heusler alloy comprises $Co_2MnSi$, $Co_2MnAl$, $Co_2(Cr_{0.6}Fe_{0.4})Al$, or the like. The Heusler alloy has a crystalline structure (L21 structure) shown in FIG. 3 or a B2 structure, not shown, and provides a high polarizability with these structures. The Heusler alloy does not exhibit the L21 structure or the B2 structure when it is grown as a film, but develops the L21 structure or the B2 structure when it is subsequently heated such as for annealing.

The layer of Heusler alloy may be included not only in free layer 45, but also in inner layer 43*c*. In this case, inner layer 43*c* may be made of a Heusler alloy in its entirety, or may be of a laminated structure made up of a layer of Heusler alloy and a layer of CoFe or NiFe. If inner layer 43*c* is of the laminated structure, then the layer of Heusler alloy is disposed near spacer layer 44.

Cap layer 46 is provided to prevent deterioration of MR element 4, and is made of Ru, for example.

Hard bias films 48 are disposed on opposite sides of MR element 4 in a track width direction (an in-plane direction of each of the layers of MR element 4 within a plane parallel to surface S to face a recording medium), with insulating films 47 interposed therebetween. Hard bias films 48 apply a biasing magnetic field in the track width direction to free layer 45 to turn free layer 45 into a single magnetic domain. Hard bias films 48 are made of a hard magnetic material such as CoPt, CoCrPt, or the like, for example. Insulating films 47 serve to prevent the sensing current from leaking into hard bias films 48, and may be in the form of an oxide film of $Al_2O_3$, for example.

The most characteristic structure of the present embodiment will be described below. The most characteristic structure of the present embodiment is that oxide 49 is present in the interface between spacer layer 44 and free layer 45. Oxide 49 is not in the form of a continuous film, but in the form of sea-islands distributed on spacer layer 44. Since free layer 45 has the Heusler alloy layer held in contact with spacer layer 44, the Heusler alloy layer is disposed over oxide 49.

Oxide 49 may comprise an oxide of any desired material. Preferably, oxide 49 is made of a material having a higher energy level for bonding itself to oxygen than the material of spacer layer 44 which serves as a base for oxide 49. According to one general process of forming oxide 49 on spacer layer 44, the raw material of oxide 49 is deposited in the form of sea-islands on spacer layer 44 and thereafter exposing the intermediate laminated body wherein the raw material is deposited to an oxygen atmosphere for thereby oxidizing the raw material. If the raw material of oxide 49 has a higher energy level for bonding itself to oxygen than the material of spacer layer 44, then the raw material of oxide 49 is oxidized in preference to spacer layer 44, preventing spacer layer 44 from being oxidized.

If spacer layer 44 is made of Cu, then the raw material of oxide 49 should preferably be a material having an energy level of 500 kJ/mol. or higher for bonding itself to oxygen. When oxide 49 is formed of such a raw material, only the raw material deposited on spacer layer 44 can be oxidized, whereas spacer layer 44 of Cu is not essentially oxidized.

Materials having an energy level of 500 kJ/mol. or higher for bonding itself to oxygen include Al, Si, Mg, Ti, V, Zr, Nb, Mo, Ru, Hf, Ta, W, etc. The raw material of oxide 49 may alternatively be a compound in which one or more of these materials are combined.

With oxide 49 of the stable composition being interposed between the Heusler alloy layer and spacer layer 44, mutual diffusion is suppressed between the Heusler alloy layer and spacer layer 44. As a result, the proportions of the elements of the Heusler alloy expressed by the composition formula $X_2YZ$ are nearly represented by the stoichiometric composition X:Y:Z=2:1:1. The Heusler alloy layer can thus have the L21 structure or the B2 structure in its most part for a high polarizability. The effect of the Heusler alloy is thus effectively utilized for a large MR ratio.

Because oxide 49 is not formed as a continuous film, but is formed as sea-islands, any increase in the areal resistance value RA (the resistance value of a element shape having a cross-sectional area of 1 μm×1 μm) of MR element 4 is held to a minimum. If oxide 49 is formed as a continuous film, then the RA becomes too high for the sensing current to flow, making the high-frequency response low.

In the above description, pinned layer 43 is a synthetic pinned layer. However, it may be a pinned layer made of only a ferromagnetic material.

The ratio of the total area of the region where oxide 49 is provided to the entire interface between the Heusler alloy layer and spacer layer 44 should preferably be as large as possible from the standpoint of reduced mutual diffusion, but should preferably be as small as possible from the standpoint of reduced increase in the RA. After considering these factors comprehensively, the ratio of the total area of the region where oxide 49 is provided to the entire interface between the Heusler alloy layer and spacer layer 44 should preferably be less than 50%.

MR element 4 described above can be fabricated as follows:

Buffer layer 41, antiferromagnetic layer 42, outer layer 43a, nonmagnetic intermediate layer 43b, inner layer 43c, and spacer layer 44 are successively formed on lower shield layer 13. Thereafter, oxide 49 is formed on spacer layer 49, and free layer 45 and cap layer 46 are successively formed over oxide 49. After cap layer 46 is formed, the assembly is annealed to turn the Heusler alloy contained in free layer 45 into the L21 structure or the B2 structure. A film growth process such as a sputtering process, which is the same as the process of fabricating the conventional MR element, may be employed except for the formation of oxide 49.

If inner layer 43c contains a Heusler alloy, then the Heusler alloy contained in inner layer 43c tends to have the L21 structure or the B2 structure when it is annealed. In the present embodiment, as no oxide is present in the interface between inner layer 43c and spacer layer 44, more mutual diffusion occurs between inner layer 43c and spacer layer 44 than if an oxide is present therebetween, with the result that the polarizability is correspondingly less liable to increase. Nevertheless, since the Heusler alloy contained in the layer where the oxide is present provides the higher polarizability, the MR element has a large MR ratio as a whole.

As described above, oxide 49 can be formed by depositing the raw material of oxide 49 on spacer layer 44 and oxidizing the deposited raw material. The raw material may be deposited by a general film growth process such as a sputtering process similar to the process of forming other layers. The raw material can be formed as sea-islands by depositing itself at a rate not to form a continuous film such that the mass film thickness which is determined from the film growth rate ranges from about 0.1 to 0.3 nm. The deposited raw material is oxidized by exposing the intermediate laminated body wherein the raw material of oxide 49 is deposited to an oxide atmosphere. The deposited raw material may alternatively be oxidized by exposing the intermediate laminated body to an oxygen plasma.

Experiments 1, 2, shown below, were conducted in order to confirm the advantages of oxide 49.

(Experiment 1)

Figure 2:
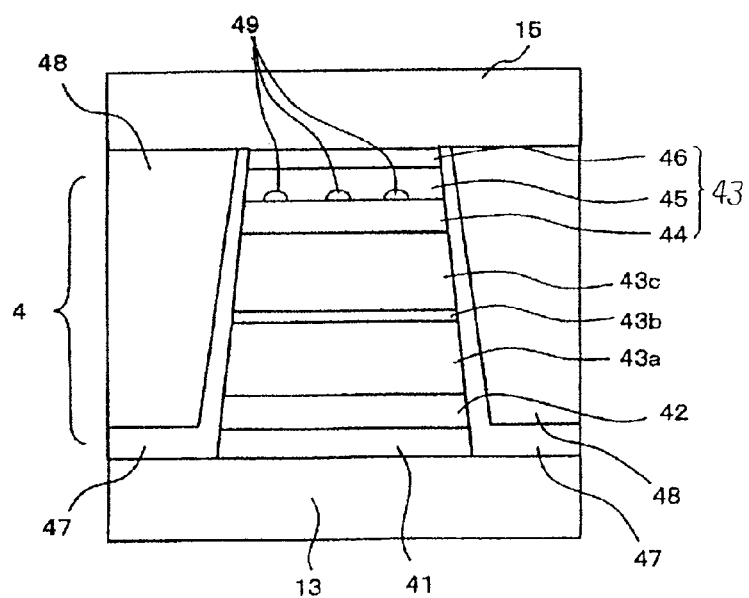
FIG. 2 is a view of an MR element shown in FIG. 1 as viewed from a surface to face a recording medium thereof.

In Experiment 1, the MR element shown in FIG. 2 was fabricated. A specific layer configuration and materials, etc. of the layers are shown in Table 1.

TABLE 1

| | Material | Film thickness (nm) |
|---|---|---|
| Cap layer | Ru | 10 |
| Free layer | Heusler alloy/NiFe | 2/2 |
| Oxide | AlSiOx | 0.35 |
| Spacer layer | Cu | 2 |
| Pinned layer Inner layer | CoFe/Heusler alloy | 1/3 |
| Nonmagnetic intermediate layer | Ru | 0.8 |
| Outer layer | FeCo | 2.5 |
| Antiferromagnetic layer | IrMn | 7 |
| Buffer layer | Ta/Ru | 1/2 |

"/" in Table 1 means that the material on the left side of "/" is in a layer below the material on the right side, i.e., in a previously formed layer. The film thickness in Table 1 refers to a mass film thickness determined from the film growth rate. Therefore, the oxide is actually formed as sea-islands rather than a continuous film.

Nine samples with different oxidation times for forming the oxide were prepared as MR elements for experimentation. The junction size of each sample was 0.2 μm×0.2 μm. The annealing process for crystallizing the Heusler alloy layer after all layers were grown was performed at 270° C. for 3 hours.

Figure 4:
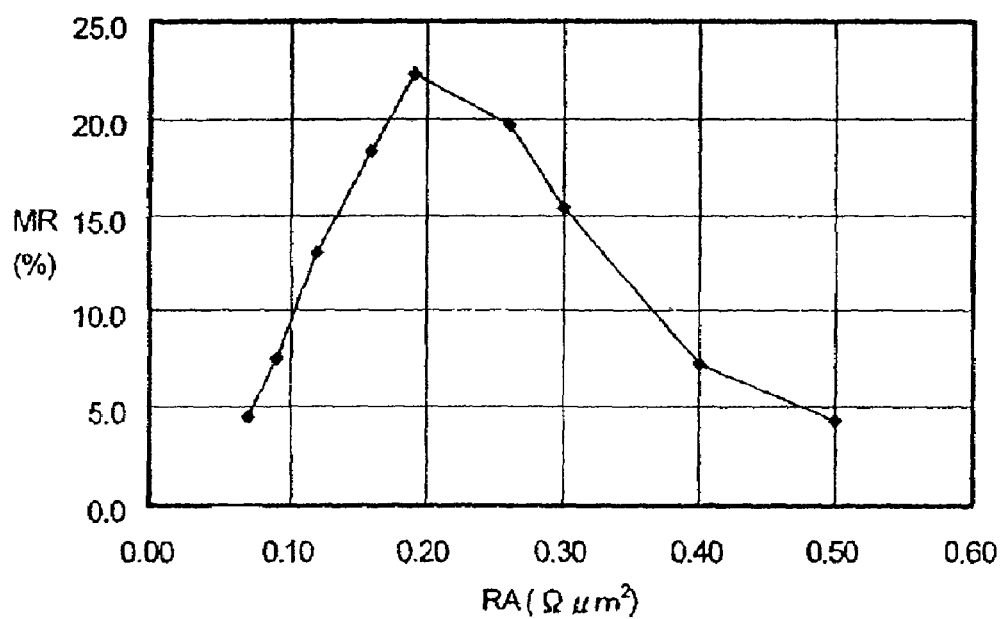
FIG. 4 is a graph showing the relationship of an RA and an MR ratio of a sample fabricated in Experiment 1.

Table 2 shows materials of the Heusler alloy, oxidation times for forming the oxide, RA values, and MR ratios of the respective samples. FIG. 4 is a graph showing the relationship between the RA values and the MR ratios obtained in Experiment 1.

TABLE 2

| Sample No. | Heusler alloy material | Oxidation time (sec.) | RA ($\Omega \mu m^2$) | MR ratio (%) |
|---|---|---|---|---|
| 1-1 | $Co_2MnSi$ | 0 | 0.07 | 4.5 |
| 1-2 | ↑ | 30 | 0.09 | 7.5 |
| 1-3 | ↑ | 60 | 0.12 | 13.1 |
| 1-4 | ↑ | 90 | 0.16 | 18.3 |
| 1-5 | ↑ | 120 | 0.19 | 22.3 |
| 1-6 | ↑ | 150 | 0.26 | 19.7 |
| 1-7 | ↑ | 180 | 0.30 | 15.4 |
| 1-8 | ↑ | 240 | 0.40 | 7.2 |
| 1-9 | ↑ | 300 | 0.50 | 4.3 |

It can be seen from Table 2 that the RA increases as the oxidation time becomes longer. This is considered to be caused by the fact that as the oxidation time is longer, the degree of oxidation of the oxide becomes higher, allowing a less current to flow through the MR element. It can also be understood from the graph shown in FIG. 4 that a high MR ratio of 10% or more is achieved for the RA in the range from 0.10 $\Omega\mu m^2$ to 0.36 $\Omega\mu m^2$.

It is to be noted that whereas the MR ratio increases as the RA increases up to about 0.2 Ωμm², the MR ratio decreases as the RA increases, beyond the peak of 0.2 Ωμm². This phenomenon is considered to occur for the following reasons: Up to the RA of about 0.2 Ωμm², the material of the spacer layer is effectively prevented from being diffused into the free layer because of the presence of the oxide, so that the Heusler alloy layer maintains a stoichiometric composition. Therefore, the Heusler alloy layer is liable to turn into the L21 structure or the B2 structure when it is subsequently annealed, resulting in a high polarizability and a high MR ratio. If the RA is too high (the degree of oxidation of the oxide is too high), then though the material of the spacer layer is less likely to be diffused into the free layer, the oxygen in the oxide is diffused into the free layer, forcing the Heusler alloy layer to depart from the stoichiometric composition. Therefore, the Heusler alloy layer is less liable to turn into the L21 structure or the B2 structure when it is subsequently annealed, resulting in a low polarizability and a low MR ratio. However, since the high MR ratio of 10% or more is achieved up to the RA of about 0.36 Ωμm², the Heusler alloy layer is considered to virtually have a stoichiometric composition for the RA in the range from 0.10 Ωμm² to 0.360 Ωμm². Stated otherwise, if the RA falls out of the range from 0.10 Ωμm² to 0.36 Ωμm², then the Heusler alloy layer is considered to depart greatly from the stoichiometric composition.

(Experiment 2)

In Experiment 2, ten samples with different materials of the Heusler alloy layer and different materials of the oxide, in the film configuration as shown in Table 1, were prepared and measured for RA values and MR ratios. The oxidation time for forming the oxide was 120 seconds for all the samples. Table 3 shows materials of the Heusler alloy, materials of the oxide, RA values, and MR ratios of the respective samples.

TABLE 3

| Sample No. | Heusler alloy material | Oxide material | RA (Ω μm²) | MR ratio (%) |
|---|---|---|---|---|
| 2-1 | Co₂MnSi | AlO$_x$ | 0.21 | 23.5 |
| 2-2 | ↑ | SiO$_x$ | 0.22 | 20.5 |
| 2-3 | ↑ | SiMgO$_x$ | 0.23 | 21.8 |
| 2-4 | ↑ | AlSiO$_x$ | 0.19 | 22.3 |
| 2-5 | CoFeSi | AlO$_x$ | 0.18 | 25.1 |
| 2-6 | Co₂(FeMn)Si | AlO$_x$ | 0.24 | 23.8 |
| 2-7 | Co₂(Mn)Al | AlO$_x$ | 0.22 | 22.1 |
| 2-8 | (CoRh)₂MnSi | AlO$_x$ | 0.22 | 24.3 |
| 2-9 | (CoIr)₂MnSi | AlO$_x$ | 0.25 | 20.3 |
| 2-10 | CoMnGe | AlO$_x$ | 0.18 | 21.1 |

It can be seen from Table 3 that the RA of each sample was in the range from 0.18 Ωμm² to 0.25 Ωμm² and was of a sufficiently low value. The MR ratios of all the samples were greater than 20% and hence were very high. Therefore, it is understood that the effect produced by interposing the oxide between the spacer layer and the Heusler alloy layer does not depend on the material of the Heusler alloy layer and the material of the oxide. Since the MR ratio of either one of the samples is high, the Heusler alloy layer virtually has a stoichiometric composition.

As is apparent from the above experimental results, an MR element maintaining a low RA and having a high MR ratio is obtained by employing a structure wherein an oxide is distributed as sea-islands between a spacer layer and a Heusler alloy layer and the Heusler alloy layer virtually has a stoichiometric composition. From another standpoint, an MR element having a high MR ratio as well as a low RA is obtained by employing a structure wherein an oxide is provided as sea-islands between a spacer layer and a Heusler alloy layer and the RA is in the range from 0.10 Ωμm² to 0.36 Ωμm².

An MR element according to another embodiment will be described below with reference to FIG. 5.

Figure 5:
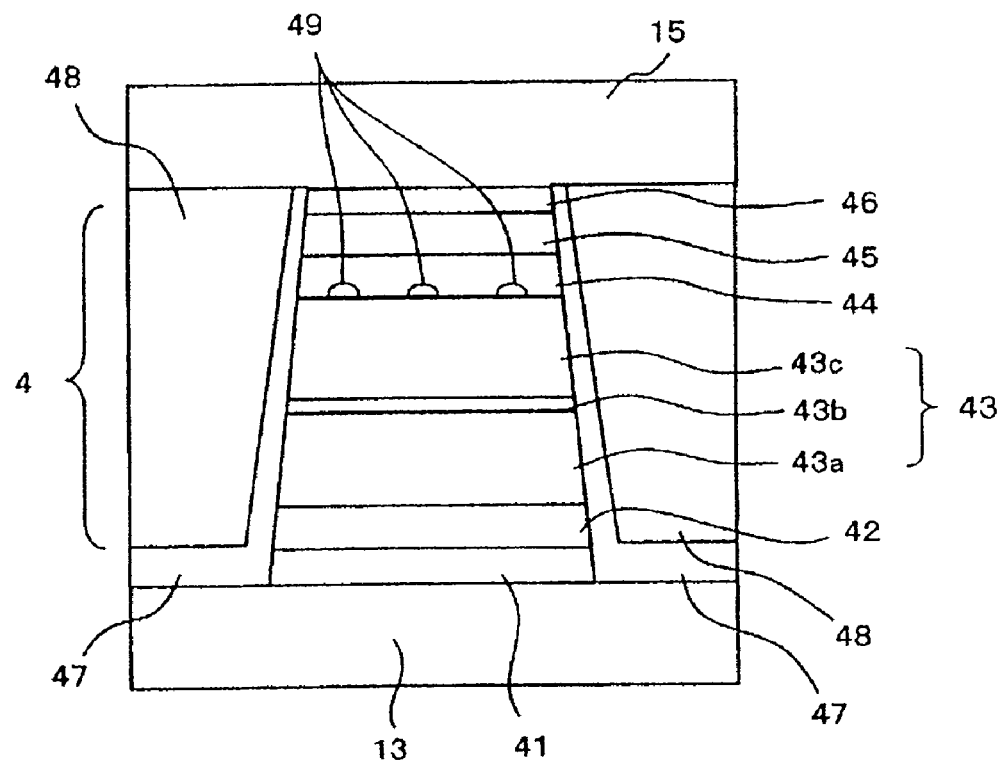
FIG. 5 is a view similar to FIG. 2, showing an MR element according to another embodiment.

In MR element 4 shown in FIG. 5, a Heusler alloy layer is formed in a region of inner layer 43c near at least its interface with spacer layer 44, and oxide 49 is disposed in the interface between inner space 43c and spacer layer 44, rather than the interface between free layer 45 and spacer layer 44. Other details are the same as the details shown in FIG. 2. In FIG. 5, therefore, those parts which correspond to those shown in FIG. 2 are denoted by identical reference characters and will not be described below.

Inner layer 43c may be made of a Heusler alloy in its entirety or may be of a laminated structure made of a Heusler alloy and another magnetic material such as NiFe, CoFe, or the like, for example. If inner layer 43 is of a laminated structure made of a Heusler alloy and another magnetic material, then the region thereof near spacer layer 44 is made of a Heusler alloy. The Heusler alloy has the L21 structure or the B2 structure. The Heusler alloy may be the same as described above, and has a stoichiometric composition. Oxide 49 is distributed as sea-islands Oxide 49 may be any desired oxide, and should preferably be made of a material having a higher energy level for bonding itself to oxygen than the material of inner layer 43c which serves as a base for oxide 49. The RA of MR element 4 is in the range from 0.10 Ωμm² to 0.36 Ωμm².

The same advantages as those described in the above embodiment can be achieved by thus providing a Heusler alloy layer in inner layer 43c and providing oxide 49 in the interface between inner layer 43c and spacer layer 44. In other words, a low RA is maintained, and a large MR ratio is accomplished by utilizing a high polarizability due to the Heusler alloy being of a particular crystalline structure. In the present embodiment, at least inner layer 43c contains a Heusler alloy layer. However, free layer 45 may also contain a Heusler alloy layer.

The MR elements according to the two typical embodiments of the present invention have been described above. These embodiments may be combined with each other.

Figure 6:
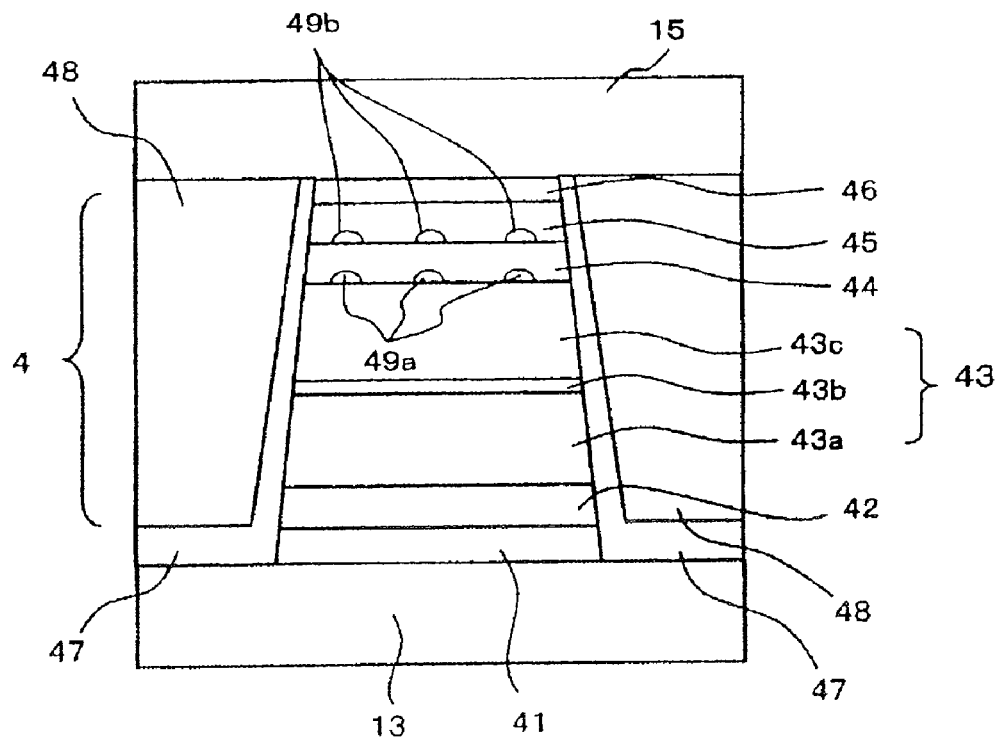
FIG. 6 is a view similar to FIG. 2, showing an MR element according to still another embodiment.

FIG. 6 shows an MR element according to still another embodiment. In MR element 4 shown in FIG. 6, at least a region of inner layer 43c in its interface with spacer layer 44 and at least a region of free layer 45 in its interface with spacer 44 are formed as respective Heusler alloy layers. In other words, both layers held against spacer layer 44 are Heusler alloy layers, respectively. The Heusler alloy contained in inner layer 43c and the Heusler alloy contained in free layer 45 may be of the same elements or different elements insofar as they are expressed by a composition formula X₂YZ or XYZ (where X represents one or more elements selected from Co, Ir, Rh, Pt, and Cu, Y represents one or more elements selected from V, Cr, Mn, and Fe, and Z represents one or more elements selected from Al, Si, Ga, Sb, and Ge).

Oxide 49a is disposed in the interface between inner layer 43c and spacer layer 44, and oxide 49b is disposed in the interface between spacer layer 44 and free layer 45. These oxides 49a, 49b are distributed as sea-islands as with the above embodiments. Each Heusler alloy layer has a stoichiometric composition, and the RA of the MR element is in the range from 0.10 Ωμm² to 0.36 Ωμm². Other details are the same as the details shown in FIG. 2. In FIG. 6, therefore, those parts which correspond to those shown in FIG. 2 are denoted by identical reference characters and will not be described below.

An MR element according to yet another embodiment of the present invention will be described below with reference to FIG. 7.

In MR element 4, Heusler base layers are disposed between oxide 49 in the form of sea-islands and Heusler alloy layers. Specifically, in the structure shown in FIG. 7, Heusler alloy layers $43c_a$, $45_a$ are disposed in inner layer 43c and free layer 45, respectively. Heusler base layers $43c_b$, $45_b$ are disposed in the respective interfaces of Heusler alloy layers $43c_a$, $45_a$ with spacer layer 44. Inner layer 43c of pinned layer 43 is of a multi-layer structure of CoFe layer $43c_c$, Heusler alloy layer $43c_a$, and Heusler base layer $43c_b$ which are successively stacked in the order named. Free layer 45 is of a multi-layer structure of Heusler base layer $45_b$, Heusler alloy layer $45_a$, and NiFe layer $45_c$ which are successively stacked in the order named. Spacer layer 44 of Cu and sea-island oxide 49 are interposed between Heusler base layer $43c_b$ of inner layer 43 and Heusler base layer $45_b$ of free layer 45.

Heusler base layers $43c_b$, $45_b$ are made of the same material (CoXY) as Heusler alloy layers $43c_a$, $45_a$, where X represents at least one of Fe, Mn, and Cr, and Y represents at least one of Si, Ge, Al, and Sb, the proportions of X and Y being 1:1. The ratio of Co in Heusler base layers $43c_b$, $45_b$ is 70 at % or greater, and Heusler base layers $43c_b$, $45_b$ have a thickness of 0.3 nm or greater.

Experiments 3, 4, shown below, were conducted in order to confirm the advantages of the above structure.

(Experiment 3)

Figure 7:
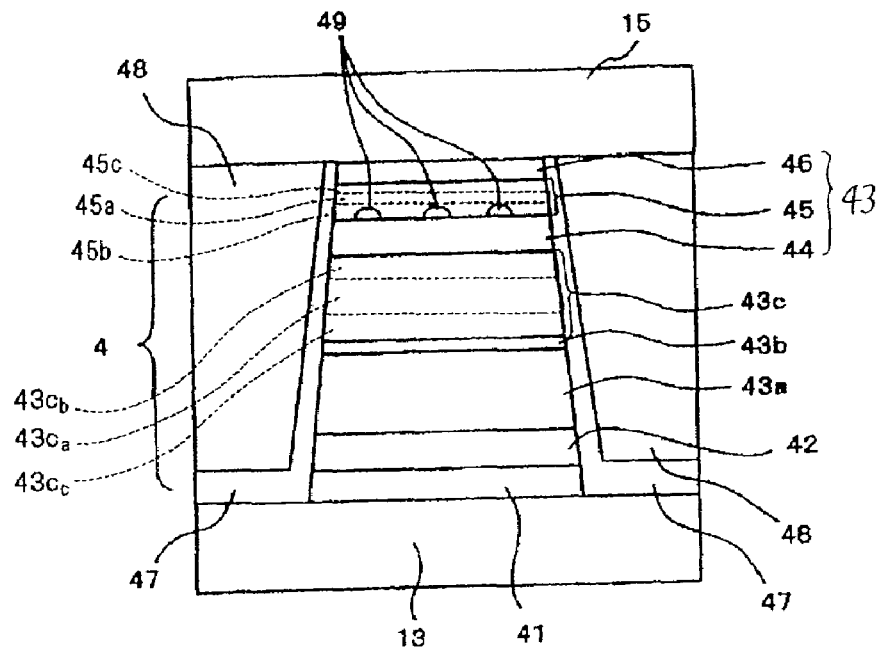
FIG. 7 is a view similar to FIG. 2, showing an MR element according to yet another embodiment.

In Experiment 3, MR element 4 shown in FIG. 7 was fabricated. A specific layer configuration and materials, etc. of the layers are shown in Table 4.

TABLE 4

| | Material | Film thickness (nm) |
|---|---|---|
| Cap layer | Ru | 10 |
| Free layer | CoMnSi/Co$_2$MnSi/NiFe | 0-1.5/3/2 |
| Oxide | AlO$_x$ | 0.35 |
| Spacer layer | Cu | 2 |
| Pinned layer Inner layer | CoFe/Co$_2$MnSi/CoMnSi | 1/3/0-1.5 |
| Nonmagnetic intermediate layer | Ru | 0.8 |
| Outer layer | FeCo | 2.5 |
| Antiferromagnetic layer | IrMn | 7 |
| Buffer layer | Ta/Ru | 1/2 |

Seven samples (samples 3-1 through 3-7) with different contents, ranging from 50% to 100%, of Co in Heusler base layers $43c_b$, $45_b$ having a thickness of 1 nm, and four samples (samples 3-8 through 3-11) with different thicknesses, ranging from 0 nm to 1.5 nm, of Heusler base layers $43c_b$, $45_b$ based on sample 34 wherein the content of Co in Heusler base layers $43c_b$, $45_b$ is 80%, were prepared as MR elements 4 for experimentation. The proportions of Mn and Si in Heusler base layers $43c_b$, $45_b$ were 1:1 in all the samples.

The junction size of each sample was 0.2 μm×0.2 μm. The annealing process for crystallizing Heusler alloy layers $43c_a$, $45_a$ after all layers were grown was performed at 270° C. for 3 hours. Sea-island oxide 49 was formed by exposing a grown film of Al to an oxygen atmosphere for 240 seconds. The oxidation time was set to a long time in order to observe the effect of excessive oxidation.

Table 5 shows materials of Heusler alloy layers $43c_a$, $45_a$, materials of Heusler base layers $43c_b$, $45_b$, Co contents, thicknesses, RA values, and MR ratios of the respective samples.

TABLE 5

| | Heusler alloy layer | Heusler base layer | | | | |
|---|---|---|---|---|---|---|
| Sample No. | Material | Material | Co content (at %) | Film thickness (nm) | RA (Ω μm$^2$) | RA ratio (%) |
| 3-1 | Co$_2$MnSi | CoMnSi alloy | 100 | 1.0 | 0.14 | 17.3 |
| 3-2 | ↑ | ↑ | 95 | 1.0 | 0.15 | 22.3 |
| 3-3 | ↑ | ↑ | 90 | 1.0 | 0.16 | 25.3 |
| 3-4 | ↑ | ↑ | 80 | 1.0 | 0.19 | 25.8 |
| 3-5 | ↑ | ↑ | 70 | 1.0 | 0.25 | 17.8 |
| 3-6 | ↑ | ↑ | 60 | 1.0 | 0.38 | 8.5 |
| 3-7 | ↑ | ↑ | 50 | 1.0 | 0.41 | 7.8 |
| 3-8 | ↑ | ↑ | 80 | 0 | 0.42 | 7.5 |
| 3-9 | ↑ | ↑ | 80 | 0.3 | 0.25 | 18.3 |
| 3-10 | ↑ | ↑ | 80 | 0.5 | 0.21 | 24.7 |
| 3-11 | ↑ | ↑ | 80 | 1.5 | 0.18 | 20.9 |

According to samples 3-1 through 3-7 shown in Table 5, the RA was 0.3 or less and the MR ratio was 10% or greater, if the content of Co in Heusler base layers $43c_b$, $45_b$ was 70 at % or greater. This is considered to be caused by the fact that if the content of Co is smaller, Mn and Si are oxidized relatively easily for higher resistance, resulting in a lower MR ratio, and if the content of Co is 70 at % or greater, the content of Co that is less oxidizable is large enough to suppress higher resistance. Sea-island oxide 49 prevents Cu of Heusler base layers $43c_b$, $45_b$ and spacer layer 44 from being diffused, so that Heusler alloy layers $43c_a$, $45_a$ have a higher polarizability. According to samples 3-4, 3-8 through 3-11 shown in Table 5, the effect of excessive oxidation can be suppressed if the film thickness of Heusler base layers $43c_b$, $45_b$ is 0.3 nm or greater.

(Experiment 4)

In Experiment 4, eleven samples (samples 4-1 through 4-11) with different contents of Co in Heusler base layers $43c_b$, $45_b$, as with Experiment 3, Heusler alloy layers $43c_a$, $45_a$ and Heusler base layers $43c_b$, $45_b$ being made of Co$_2$MnGe, were prepared as shown in Table 6. The proportions of Mn and Ge in Heusler base layers $43c_b$, $45_b$ were 1:1 in all the samples.

TABLE 6

| | Material | Film thickness (nm) |
|---|---|---|
| Cap layer | Ru | 10 |
| Free layer | CoMnSi/Co$_2$MnGe/NiFe | 0-1.5/3/2 |
| Oxide | AlO$_x$ | 0.35 |
| Spacer layer | Cu | 2 |
| Pinned layer Inner layer | CoFe/Co$_2$MnGe/CoMnGe | 1/3/0-1.5 |
| Nonmagnetic intermediate layer | Ru | 0.8 |
| Outer layer | FeCo | 2.5 |
| Antiferromagnetic layer | IrMn | 7 |
| Buffer layer | Ta/Ru | 1/2 |

Table 7 shows materials of Heusler alloy layers $43c_a$, $45_a$, materials of Heusler base layers $43c_b$, $45_b$, Co contents, thicknesses, RA values, and MR ratios of the respective samples.

TABLE 7

| Sample No. | Heusler alloy layer Material | Heusler base layer Material | Co content (at %) | Film thickness (nm) | RA (Ω μm²) | RA ratio (%) |
| --- | --- | --- | --- | --- | --- | --- |
| 3-1 | Co₂MnGe | CoMnGe alloy | 100 | 1.0 | 0.15 | 18.0 |
| 3-2 | ↑ | ↑ | 95 | 1.0 | 0.16 | 23.4 |
| 3-3 | ↑ | ↑ | 90 | 1.0 | 0.18 | 25.8 |
| 3-4 | ↑ | ↑ | 80 | 1.0 | 0.20 | 26.4 |
| 3-5 | ↑ | ↑ | 70 | 1.0 | 0.26 | 19.3 |
| 3-6 | ↑ | ↑ | 60 | 1.0 | 0.39 | 9.2 |
| 3-7 | ↑ | ↑ | 50 | 1.0 | 0.42 | 7.9 |
| 3-8 | ↑ | ↑ | 80 | 0 | 0.42 | 7.4 |
| 3-9 | ↑ | ↑ | 80 | 0.3 | 0.26 | 18.8 |
| 3-10 | ↑ | ↑ | 80 | 0.5 | 0.22 | 25.5 |
| 3-11 | ↑ | ↑ | 80 | 1.5 | 0.19 | 21.8 |

In Experiment 4, as with Experiment 3, the RA was 0.3 or less and the MR ratio was 10% or greater if the content of Co in Heusler base layers $43c_b$, $45_b$ was 70 at % or greater. It was found that the effect of excessive oxidation can be suppressed if the film thickness of Heusler base layers $43c_b$, $45_b$ is 0.3 nm or greater.

The embodiment shown in FIG. 7 is the same as the embodiment shown in FIG. 2 except for Heusler base layers $43c_b$, $45_b$, and no further description thereof will be given below. In the embodiment shown in FIG. 7, since Heusler alloy layers $43c_a$, $45_a$ are present in both free layer 45 and inner layer 43c, Heusler base layers $43c_b$, 45b are provided in contact therewith. However, if a Heusler alloy layer is present in only one of free layer 45 and inner layer 43c, then only a Heusler base layer may be provided in contact with the Heusler alloy layer.

In the structure wherein sea-island oxide 49 is disposed between inner layer 43c and spacer layer 44 as shown in FIG. 5, and also in the structure wherein sea-island oxide 49 is disposed between free layer 45 and spacer layer 44 and between inner layer 43c and spacer layer 44, Heusler base layers may be provided in contact with Heusler alloy layers as shown in FIG. 7 to achieve the same advantages as described above.

Figure 8:
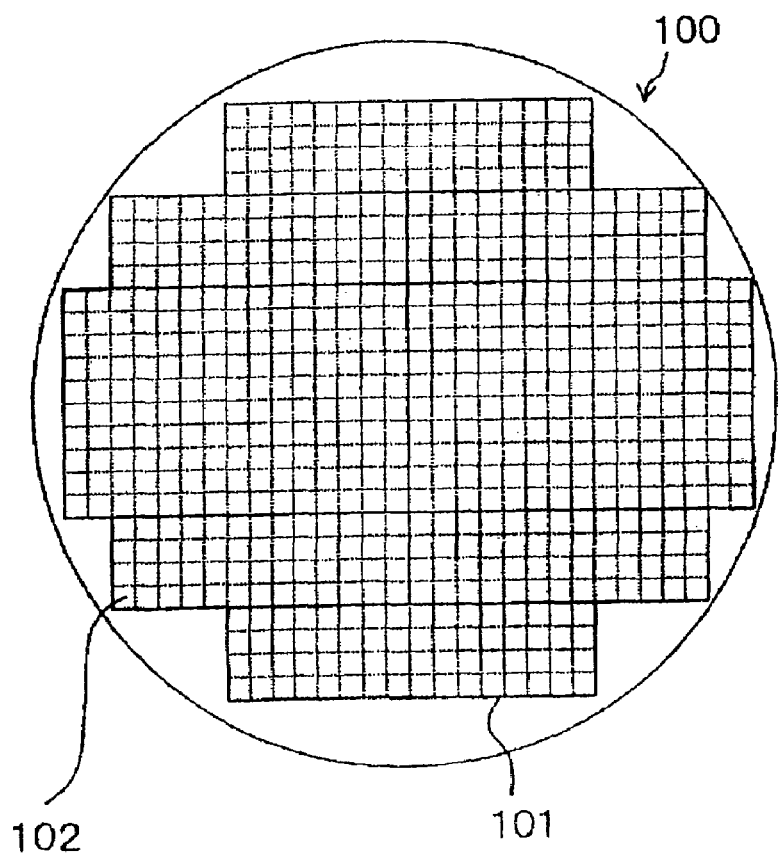
FIG. 8 is a plan view of a wafer in which thin-film magnetic heads shown in FIG. 1 are formed.

Many thin-film magnetic heads according to the present invention are formed in a single wafer. FIG. 8 is a conceptual plan view of a wafer having many structures each including the thin-film magnetic head shown in FIG. 1.

Wafer 100 is divided into a plurality of head element aggregates 101 each including a plurality of head elements 102 each serving as a working unit for polishing surface S to face a recording medium of thin-film magnetic head 1 (see FIG. 1). Dicing portions (not shown) are provided between head element aggregates 101 and also provided between head elements 102. Head element 102 is a structural body including the structure of thin-film magnetic head 1, and becomes thin-film magnetic head 1 after having been subjected to necessary working steps such as polishing to form surface S to face a recording medium. The polishing process is carried out generally on a plurality of head elements 102 which has been cut out into a row.

Figure 9:
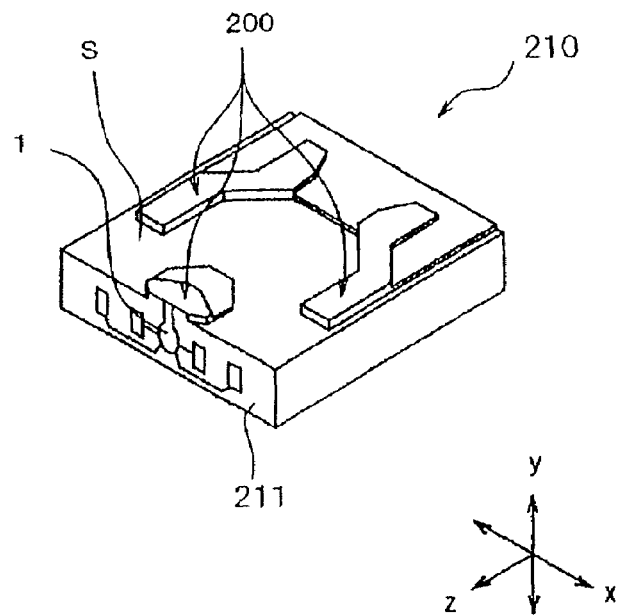
FIG. 9 is a perspective view of a slider including the thin-film magnetic head shown in FIG. 1.

A head gimbal assembly and a hard disk drive having the thin-film magnetic head according to the present invention will be described below. First, slider 210 included in the head gimbal assembly will be described below with reference to FIG. 9. In the hard disk drive, slider 210 is arranged opposite to a hard disk, which is a rotationally-driven disc-shaped recording medium. Slider 210 has thin-film magnetic head 1 obtained from head element 102 (see FIG. 8). Slider 210 has a substantially-hexahedral shape in which surface S to face a recording medium is formed into an air bearing surface 200 which is positioned opposite to the hard disk. When the hard disk rotates in z direction in FIG. 9, an air stream passing between the hard disk and slider 210 applies a lifting force to slider 210 downward in y direction. Slider 210 is lifted from the surface of the hard disk by the lifting force. X directions in FIG. 9 represent a direction transverse to the tracks of the hard disk. At the end surface 211 on the outlet side of the airflow of slider 210, electrode pads for input or output of signal to/from reproducing unit 2 and recording unit 3 (see FIG. 1). Surface 211 is the upper end face in FIG. 1.

Head gimbal assembly 220 will be described below with reference to FIG. 10. Head gimbal assembly 220 has slider 210 and suspension 221 by which slider 210 is resiliently supported. Suspension 221 comprises load beam 222 in the form of a leaf spring made of stainless steel, for example, flexure 223 mounted on an end of load beam 222 for giving slider 210 an appropriate degree of freedom, slider 210 being joined to flexure 223, and base plate 224 mounted on the other end of load beam 222. Base plate 224 is mounted on arm 230 of an actuator for moving slider 210 in x directions transverse to the tracks of hard disk 262. The actuator has arm 230 and a voice-oil motor for moving arm 230. A gimbal for keeping slider 210 at a constant attitude is mounted on a portion of flexure 223 where slider 210 is installed.

Head gimbal assembly 220 is mounted on arm 230 of the actuator. A structure wherein head gimbal assembly 220 is mounted on single arm 230 is referred to as a head arm assembly. A structure wherein a carriage has a plurality of arms and head gimbal assembly 220 is mounted on each of the arms is referred to as a head stack assembly.

Figure 10:
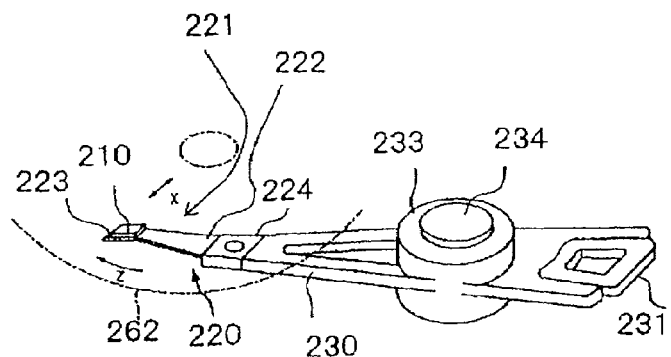
FIG. 10 is a perspective view of a head gimbal assembly including the slider shown in FIG. 8.

FIG. 10 shows a head arm assembly by way of example. In the head arm assembly, head gimbal assembly 220 is mounted on an end of arm 230. Coil 231 which is part of the voice-coil motor is mounted on the other end of arm 230. In the intermediate portion of arm 230, bearing 233 which is attached to shaft 234 for rotatably supporting arm 230 is provided.

Figure 11:
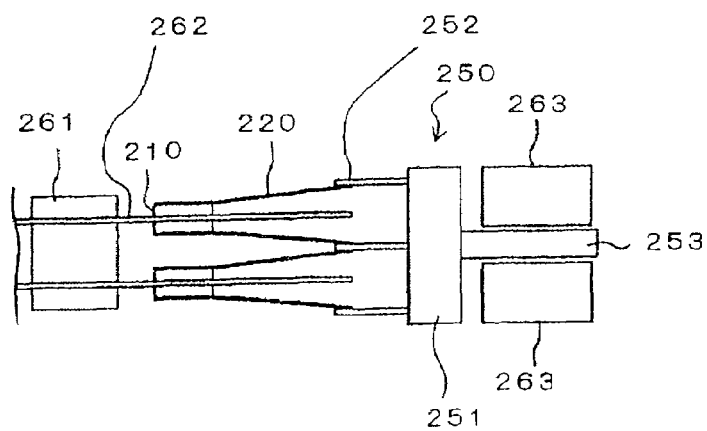
FIG. 11 is a side elevational view of a major portion of a hard disk drive including the head gimbal assembly shown in FIG. 10.
Figure 12:
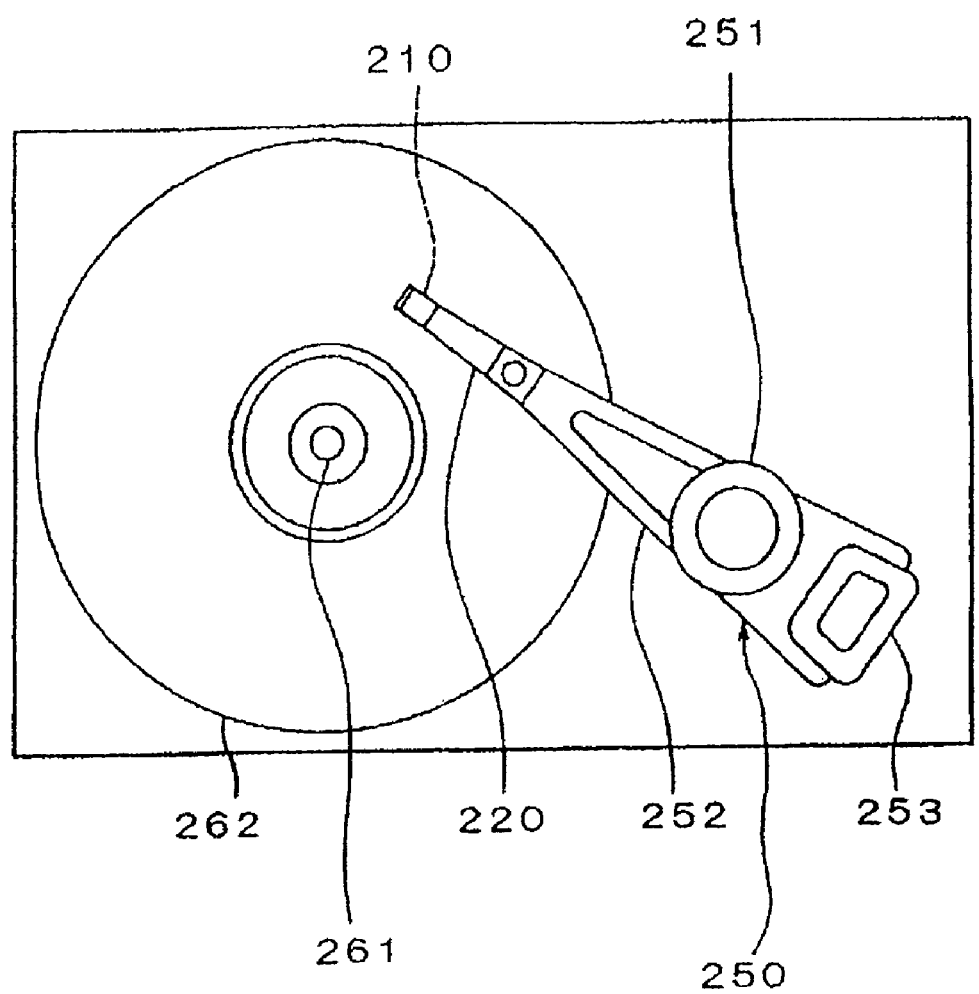
FIG. 12 is a plan view of the hard disk drive including the head gimbal assembly shown in FIG. 10.

A head stack assembly and a hard disk drive will be described below with reference to FIGS. 11 and 12. FIG. 11 is a view showing a major portion of a hard disk drive, and FIG. 12 is a plan view of the hard disk drive. Head stack assembly 250 has carriage 251 having a plurality of arms 252. A plurality of head gimbal assemblies 220 are attached to a plurality of arms 252 such that head gimbal assemblies 220 are arranged apart from each other in the vertical direction. Coil 253, which constitutes a part of the voice-coil motor, is attached to carriage 251 on the side opposite to arms 252. Head stack assembly 250 is installed in a hard disk drive. The hard disk drive has a plurality of hard disks 262 mounted on spindle motor 261. Two sliders 210 are arranged at positions opposite to each other interposing hard disk 262 therebetween. The voice coil motor has permanent magnets 263 which are arranged in positions opposite to each other interposing coil 253 of head stack assembly 250 therebetween.

Head stack assembly 250 except sliders 210 and the actuator support sliders 210 and position sliders 210 with respect to hard disks 262.

In the hard disk drive, the actuator moves sliders 210 in the directions transverse to the tracks of hard disks 262 and position sliders 210 with respect to hard disks 262. The thin-film magnetic heads included in sliders 210 record information in hard disks 262 through the recording unit, and reproduce information recorded in hard disks 262 through the reproducing unit.

The thin-film magnetic head is not limited to the above embodiments, but may be modified in various ways. For example, though a thin-film magnetic head having a structure wherein a reading MR element is disposed near a substrate and a writing induction-type electromagnetic transducer is stacked on the MR element has been described in the above embodiments, the reading MR element and the writing induction-type electromagnetic transducer may be switched around. Though a thin-film magnetic head having both an MR element and an induction-type electromagnetic transducer has been described in the above embodiments, a thin-film magnetic head may have only an MR element.

The MR element according to the present invention may be used in applications other than thin-film magnetic heads. The applications other than thin-film magnetic heads include a magnetic sensor, a magnetic memory, etc. When MR element according to the present invention is used in those applications, it also offers the same advantages as described above.

Although a certain preferred embodiment of the present invention has been shown and described in detail, it should be understood that various changes and modifications may be made without departing from the spirit or scope of the appended claims.

What is claimed is:

1. A magneto-resistance effect element, in which a sensing current flows perpendicularly to a layer surface, comprising:
    a pinned layer having a fixed magnetization direction;
    a free layer having a magnetization direction variable depending on an external magnetic field;
    a nonmagnetic spacer layer disposed between said pinned layer and said free layer;
    at least one of said pinned layer and said free layer including a Heusler alloy layer which is disposed adjacent to said spacer layer and which virtually has a stoichiometric composition;
    an oxide distributed as a discontinuous film between at least one of the Heusler alloy layers and said spacer layer; and
    a Heusler base layer disposed between said oxide distributed as the discontinuous film and said Heusler alloy layer,
    said Heusler alloy layer being made of a Heusler alloy expressed by a composition formula $X_2YZ$ or XYZ (where X represents one or more elements selected from Co, Ir, Rh, Pt, and Cu, Y represents one or more elements selected from V, Cr, Mn, and Fe, and Z represents one or more elements selected from Al, Si, Ga, Sb, and Ge), and said Heusler base layer being made of CoXY, Co being 70 at % or greater and less than 100 at %, X representing at least one of Fe, Mn, and Cr, and Y represent at least one of Si, Ge, Al, and Sb.

2. A magneto-resistance effect element according to claim 1, wherein,
    said magneto-resistance effect element having an areal resistance value in the range from 0.10 $\Omega\mu m^2$ to 0.36 $\Omega\mu m^2$.

3. A magneto-resistance effect element according to claim 1, wherein said oxide is made of at least one raw material having a higher energy level for bonding itself to oxygen than the material of a layer which serves as a base for said oxide.

4. A magneto-resistance effect element according to claim 3, wherein said free layer includes said Heusler alloy layer therein, and said spacer layer is made of Cu, and wherein said energy level for bonding said raw material to oxygen is 500 kJ/mol. or higher.

5. A magneto-resistance effect element according to claim 4, wherein said raw material comprises one or more elements selected from the group consisting of Al, Si, Mg, Ti, V, Zr, Nb, Mo, Ru, Hf, Ta, and W.

6. A magneto-resistance effect element according to claim 1, wherein said pinned layer has a nonmagnetic intermediate layer and two ferromagnetic layers interposing said nonmagnetic intermediate layer therebetween.

7. A magneto-resistance effect element according to claim 1, wherein the ratio of the total area of a region where said oxide is provided to said interface in its entirety is less than 50%.

8. A magneto-resistance effect element according to claim 1, wherein the proportions of X and Y of said Heusler base layer are 1:1.

9. A magneto-resistance effect element according to claim 1, wherein said Heusler base layer has a thickness ranging from 0.3 nm to 1.5 nm.

10. A magneto-resistance effect element according to claim 1, wherein said Heusler base layer comprises $Co_2MnGe$ or $Co_2MnSi$.

11. A magneto-resistance effect element according to claim 1, wherein said Heusler alloy layer comprises $Co_2MnGe$ or $Co_2MnSi$.

12. A thin-film magnetic head having a magneto-resistance effect element according to claim 1.

* * * * *

UNITED STATES PATENT AND TRADEMARK OFFICE
CERTIFICATE OF CORRECTION

PATENT NO. : 7,510,787 B2
APPLICATION NO. : 11/671248
DATED : March 31, 2009
INVENTOR(S) : Yoshihiro Tsuchiya et al.

It is certified that error appears in the above-identified patent and that said Letters Patent is hereby corrected as shown below:

Column 1, line 39; Change "CCP" to --CPP--.

Column 2, line 34; Change "effective-enough." to --effective enough.--.

Column 2, line 40; Change "case-where" to --case where--.

Column 2, line 57; Change "$\Omega\mu m^2 to$" to --$\Omega\mu m^2$ to--.

Column 3, line 21; Change "composes," to --comprises,--.

Column 3, line 36; Change "Go" to --Co--.

Column 4, line 35; Change "$Al_2O_3.TiC$" to --$Al_2O_3\ TiC$--.

Column 10, line 23; Change "sea-islands" to --sea-islands.--.

Column 11, line 54; Change "34" to --3-4--.

Column 13, line 29; Change "$45_a$" to --45a--.

Column 14, line 1; Change "substantially-hexahedral" to --substantially hexahedral--.

Column 16, line 6; In Claim 2, after "wherein" delete ",".

Signed and Sealed this

Thirteenth Day of October, 2009

David J. Kappos
*Director of the United States Patent and Trademark Office*